US010658723B1

(12) United States Patent
Kho et al.

(10) Patent No.: US 10,658,723 B1
(45) Date of Patent: May 19, 2020

(54) INTEGRATED HIGH PASS FILTER FOR MICROWAVE SYSTEM IN PACKAGE (71) Applicant: Naval Information Warfare Center, Pacific, San Diego, CA (US)

(72) Inventors: Yong Kho, Chula Vista, CA (US); Jia-Chi S. Chieh, San Diego, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 16/452,182

(22) Filed: Jun. 25, 2019

(51) Int. Cl.
*H01P 1/213* (2006.01)
*H01Q 23/00* (2006.01)
*H05K 1/02* (2006.01)
*H04B 1/16* (2006.01)
*H05K 1/11* (2006.01)

(52) U.S. Cl.
CPC .......... *H01P 1/2135* (2013.01); *H01Q 23/00* (2013.01); *H04B 1/1638* (2013.01); *H05K 1/025* (2013.01); *H05K 1/0242* (2013.01); *H05K 1/115* (2013.01); *H05K 2201/09827* (2013.01); *H05K 2201/10098* (2013.01)

(58) Field of Classification Search
CPC ..... H01P 1/2135; H01Q 23/00; H04B 1/1638; H05K 1/0242; H05K 1/025; H05K 1/115; H05K 2201/09827; H05K 2201/10098
USPC ....................................................... 455/130
See application file for complete search history.

(56) References Cited

U.S. PATENT DOCUMENTS

| 10,147,991 | B1 | 12/2018 | Wu et al. | |
| 2003/0080822 | A1* | 5/2003 | Tzsuang | H01P 1/2088 333/21 R |
| 2009/0243762 | A1 | 10/2009 | Chen et al. | |
| 2011/0018657 | A1* | 1/2011 | Cheng | H01P 3/121 333/239 |

(Continued)

FOREIGN PATENT DOCUMENTS

| CA | 2629035 | 9/2009 |
| CN | 104733812 | 11/2017 |

OTHER PUBLICATIONS

Kieda et al, "Full-wave simulation of microstrip line with short-circuited edge," Microwaves, Radar and Wireless Communications, 2004, MIKON-2004, pp. 222-224 vol. 1.

(Continued)

*Primary Examiner* — Lee Nguyen
(74) *Attorney, Agent, or Firm* — Naval Information Warfare Center, Pacific; Kyle Eppele; J. Eric Anderson (57) ABSTRACT

A high pass filter includes: an input-impedance-matching taper transition metal layer having an IMT input end and an IMT output end, the IMT input end having an IMT input end width, the IMT output end having an IMT output end width that is wider than the IMT input end width; a substrate integrated waveguide having a SIW input end and a SIW output end; and an output-impedance-matching taper transition metal layer having an OMT input end and an OMT output end, the OMT input end having an OMT input end width, the OMT output end having an OMT output end width that is wider than the OMT input end width. The substrate integrated waveguide is arranged such that the IMT output end is electrically connected to the SIW input end and such that the OMT input end is electrically connected to the SIW output end.

17 Claims, 6 Drawing Sheets

(56) References Cited

U.S. PATENT DOCUMENTS

| | | |
|---|---|---|
| 2012/0242547 A1 | 9/2012 | Fujii et al. |
| 2016/0056541 A1 | 2/2016 | Takeman et al. |
| 2019/0229831 A1* | 7/2019 | Aharony .......... H04B 10/25753 |

OTHER PUBLICATIONS

Wu et al., "The Substrate integrated Circuits—A New Concept for High-Frequency Electronics and Optoelectronics," TELSKIS 2003, Nis, Serbia and Montetenegro. Oct 2003.

* cited by examiner

INTEGRATED HIGH PASS FILTER FOR MICROWAVE SYSTEM IN PACKAGE

FEDERALLY-SPONSORED RESEARCH AND DEVELOPMENT

The United States Government has ownership rights in this invention. Licensing inquiries may be directed to Office of Research and Technical Applications, Naval Information Warfare Center, Pacific, Code 72120, San Diego, Calif., 92152; telephone (619) 553-5118; email: ssc_pac_t2@navy.mil. Reference Navy Case No. 104131.

BACKGROUND OF THE INVENTION

Embodiments of the disclosure relate to high pass filters for microwave systems.

For applications where a wideband radio is constantly sensing its environment, strong interferers that lie close to in-band can desensitize the receiver. This is especially true for radio receivers that operate close to high power radar bands. For this reason, microwave filters are often employed to attenuate undesirable signals while preserving signals of interest. For example, one type of receiver is designed to operate >18 GHz. However there are known high power radars below this frequency that can affect the receiver, and for this reason, a microwave high pass filter is necessary.

Typically, in order to achieve high levels of rejection, high order filters are required. Typically, filters are synthesized using lumped element equivalent models from capacitors, inductors, and resistors. The problem with realizing filters at microwave frequencies is that parasitic effects can dominate responses. For example, if a filter were designed with a spiral inductor at microwave frequencies, the inductor may not behave as an ideal inductor, and will have distributed characteristics. For this reason, synthesizing high order microwave filters using lumped elements is difficult.

A high pass filter is unique in that its behavior is much like a waveguide. A rectangular waveguide has a cut-off frequency below which it will not pass signal. A waveguide is compact in size, simple to implement as it is a transmission line modality, and has the lowest loss of all transmission line modalities. Realizing a waveguide on a printed circuit board is the challenge. A rectangular waveguide is a metal structure with set dimension based on the operating frequency.

Figure 1:
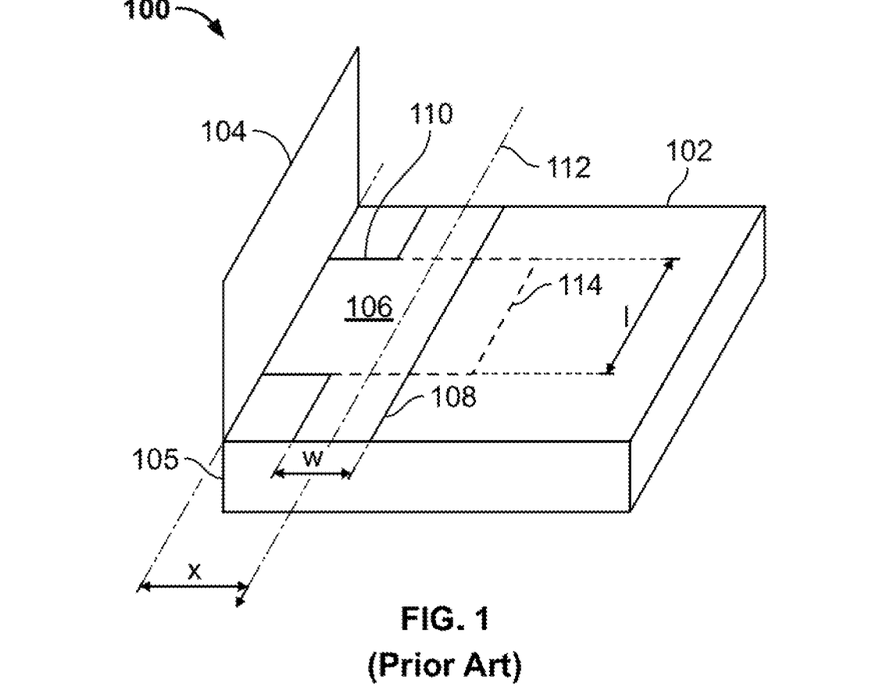
FIG. 1 illustrates a prior art high pass microwave line with a shorted edge.

A prior art high pass filter uses a microstrip with a short-circuited edge. The filter will be described in further detail with reference to FIG. 1. FIG. 1 illustrates a prior art high pass microwave line 100 with a shorted edge.

As shown in the figure, high pass microwave line 100 includes a dielectric substrate 102, an electric wall 104 and a conducting line 106. Conducting line 106 includes a transmission direction portion 108 and a folding portion 110. Electric wall 104 is disposed on a side wall 105 of dielectric substrate 102 so as to extend in a normal direction over dielectric substrate 102. Electric wall 104 provides a short to the bottom of dielectric substrate 102 for conducting line 106.

Conducting line 106 is disposed on dielectric substrate 102 such that transmission direction portion 108 is disposed to provide a direction for transmission of a radio frequency (RF) signal in a direction parallel to electric wall 104 as indicated by dotted arrow 112. Conducting line 106 is additionally disposed on dielectric substrate 102 such that a portion of folding portion 110 extends to electric wall 104, folds down over the thickness of dielectric substrate 102 and further extends to the underside of dielectric substrate 102 as indicated by dotted portion 114.

The width, w, of transmission direction portion 108 is the transmission length of high pass microwave line 100. A distance, x, is from electric wall 104 to the middle of transmission direction portion 108. The length, l, of folding portion 110 in combination with x tune the frequency of high pass microwave line 100. So changes to either l or x will change the cut off frequency of high pass microwave line 100.

Figure 2:
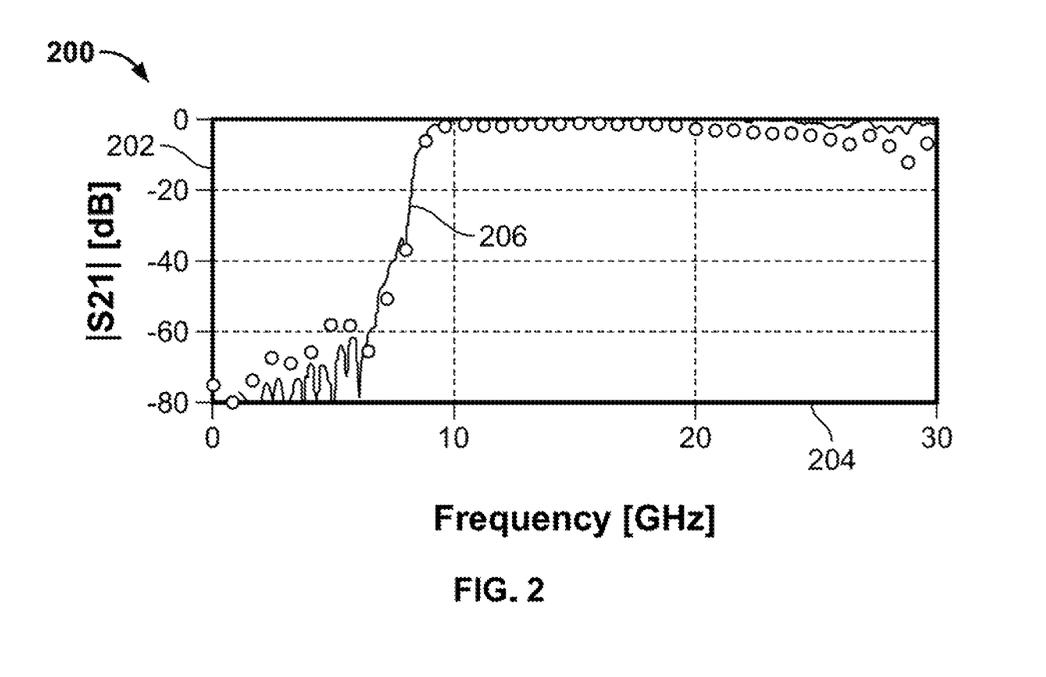
FIG. 2 illustrates a graph of the high-pass characteristics of the prior art high pass microwave line with a shorted edge of FIG. 1.

FIG. 2 illustrates a graph 200 of the band-pass characteristics of the prior art high pass microwave line 100 with a shorted edge of FIG. 1. As shown in FIG. 2, graph 200 has a y-axis 202, an x-axis 204 and a plurality of sample that follow function 206. Y-axis 202 is in decibels and corresponds to the power transfer of high pass microwave line 100. X-axis 204 is in GHz and corresponds to the frequency of the transmitted signal.

As can be seen in the figure, below the cut-off frequency of 8 GHz, the insertion loss is large, and above the cut-off frequency, the insertion loss is small. The insertion loss in the pass band is primarily due to radiation loss of the microstrip transmission line modality. Nevertheless, the roll-off of high pass microwave line 100, as noted by function 206 at about 8 GHz indicates that high pass microwave line 100 is an effective high pass filter.

Because conducting line 106 folds around dielectric substrate 102 and then electric wall 104 is disposed thereon, fabrication of high pass microwave line 100 is complicated. Further, it is very hard to provide an acceptable, clean connection between electric wall 104 and folding portion 110. When the connection has imperfections, the signal to noise ratio of high pass microwave line 100 decreases. Further, the structure of high pass microwave line 100 does not lend to easy incorporation into system on chip devices.

What is needed is a high pass filter that is useful in microwave applications for system on chip devices.

SUMMARY OF THE INVENTION

Aspects of the present disclosure are drawn to a high pass filter that is useful in microwave applications for system on chip devices.

An aspect of the present disclosure is drawn to a high pass filter that includes an input-impedance-matching taper (IMT) transition metal layer, a substrate integrated waveguide (SIW) and an output-impedance-matching taper (OMT) transition metal layer. The IMT transition metal layer has an input impedance matching taper input end and an IMT output end. The IMT input end has an IMT input end width, whereas the IMT output end has an IMT output end width that is wider than the IMT input end width. The SIW has a SIW input end and a SIW output end. The OMT transition metal layer has an OMT input end and an OMT output end. The OMT input end has an OMT input end width, whereas the OMT output end has an OMT output end width that is wider than the OMT input end width. The SIW is arranged such that the IMT output end is electrically connected to the SIW input end and such that the OMT input end is electrically connected to the SIW output end.

Another aspect of the present disclosure is drawn to a device for use with an antenna that is operable to receive an RF signal. The device includes an input for electrical connection to the antenna, an IMT transition metal layer, a SIW, an OMT transition metal layer and a receiver module. The IMT transition metal layer has an IMT input end and an IMT output end. The IMT input end has an IMT input end width, whereas the IMT output end has an IMT output end width that is wider than the IMT input end width. The SIW has a SIW input end and a SIW output end. The OMT transition metal layer has an OMT input end and an OMT output end. The OMT input end has an OMT input end width, whereas the OMT output end has an OMT output end width that is wider than the OMT input end width. The SIW is arranged such that the IMT output end is electrically connected to the SIW input end and such that the OMT input end is electrically connected to the SIW output end. The IMT input end is electrically connected to the input. The OMT output end is electrically connected to the receiver module. The IMT transition metal layer, the SIW and the OMT transition metal layer are operable to output a filtered RF signal based on the received RF signal. The receiver module is operable process the filtered RF signal.

Another aspect of the present disclosure is drawn to a method including receiving, via an input for electrical connection to an antenna, an input signal from the antenna. The method additionally includes providing the input signal to an IMT transition metal layer having an IMT input end and an IMT output end, wherein the IMT input end has an IMT input end width and the IMT output end has an IMT output end width that is wider than the IMT input end width. The method additionally includes filtering the input signal, via a SIW having a SIW input end and a SIW output end, to generate a filtered signal. The method additionally includes passing the filtered signal to an OMT transition metal layer having an OMT input end and an OMT output end, wherein the OMT input end has an OMT input end width and the OMT output end has an OMT output end width that is wider than the OMT input end width. The method additionally includes passing the filtered signal to a receiver module. The SIW is arranged such that the IMT output end is electrically connected to the SIW input end and such that the OMT input end is electrically connected to the SIW output end. The IMT input end is electrically connected to the input. The OMT output end is electrically connected to the receiver module. The IMT transition metal layer, the SIW and the OMT transition metal layer are operable to output a filtered RF signal based on the received RF signal. The receiver module is operable process the filtered RF signal.

BRIEF DESCRIPTION OF THE DRAWINGS

The accompanying drawings, which are incorporated in and form a part of the specification, illustrate example embodiments and, together with the description, serve to explain the principles of the disclosure. A brief explanation of the drawings now follows.

DETAILED DESCRIPTION OF THE EMBODIMENTS

Aspects of the present disclosure are drawn to a waveguide, on a printed circuit board, that behaves as a high pass filter for microwave system on chip devices. This device is small in size, can easily adjust the stop band attenuation without increasing complexity, and has extremely low loss.

A substrate integrated waveguide (SIW) microwave high pass filter in accordance with aspects of the present disclosure has the unique attribute that the filter attains high stop band rejection, typical of high order filters, in a compact size with minimal insertion loss in the pass band. This type of SIW microwave high pass filter is particularly suitable for microwave multi-ship module or system in package (SIP) applications.

One difference between the SIW microwave high pass filter of the present disclosure and the prior art high pass filter discussed above with reference to FIG. 1, is that in the prior art high pass filter discussed above with reference to FIG. 1, the preferred transmission line modality is a microstrip line. The main disadvantage of a microstrip filter is that the filter can radiate small amounts of energy, which is undesirable. A transmission line modality that encloses the signal is preferred as the radiation loss is much less.

A SIW is a type of rectangular waveguide that is integrated into a circuit board. The sidewalls include a via fence, and the top and bottom are solid metal. The benefits of the SIW is that it is simple to integrate into a printed circuit board, has low conductor loss because it utilizes wide metal strips, and has a steep roll-offs comparable to high order filters.

Example embodiments of a SIW in accordance with aspects of the present disclosure will now be described with reference to FIGS. 3-8.

Figure 3:
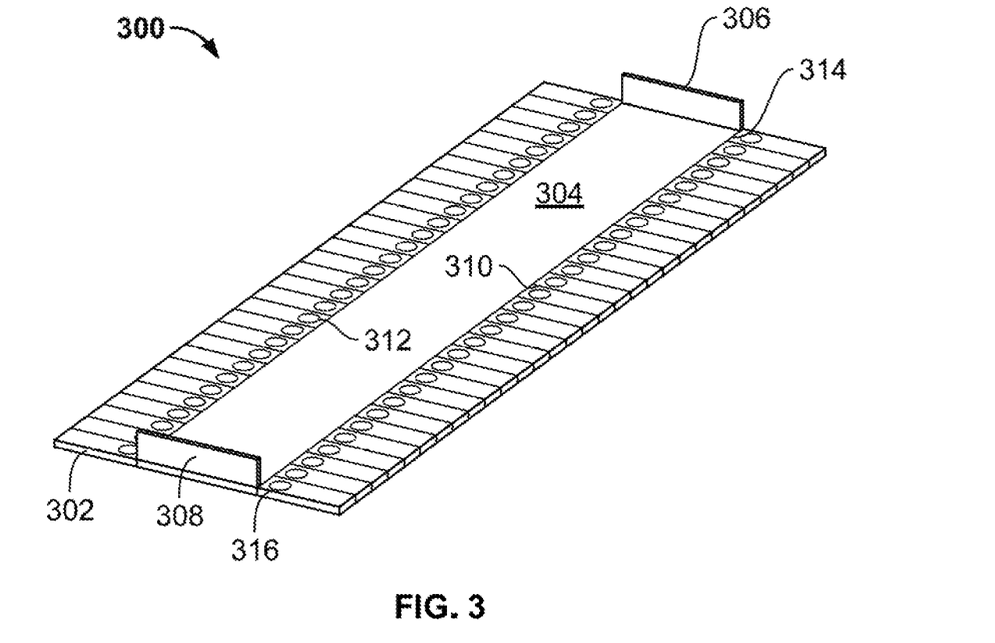
FIG. 3 illustrates an example substrate integrated waveguide in accordance with aspects of the present disclosure.

FIG. 3 illustrates an example SIW 300 for use in a microwave high pass filter in accordance with aspects of the present disclosure. As shown in the figure, SIW 300 includes a substrate 302, a conductive surface 304, an input electric wall 306, an output electric wall 308, a plurality of conductive vias 310 and a plurality of conductive vias 312.

Substrate 302 is disposed on a metal ground plane (not shown) and has a substrate input end 314 and a substrate output end 316. Input electric wall 306 is disposed at substrate input end 314. Output electric wall 308 is disposed at substrate output end 316. The plurality of conductive vias 310 are linearly disposed between substrate input end 314 and substrate output end 316. Each of plurality of conductive vias 310 is filled with an electrical conductor, thus electrically conducting conductive surface 304 to the ground plane beneath substrate 302. The plurality of conductive vias 312 are similarly linearly disposed between substrate input end 314 and substrate output end 316. Plurality of conductive vias 312 are separated from plurality of conductive vias 310. Each of plurality of conductive vias 312 is filled with the electrical conductor, thus electrically conducting conductive surface 304 to the ground plane beneath substrate 302.

While SIW 300 is a waveguide, SIW 300 performs in a manner similar to a rectangular waveguide.

Figure 4:
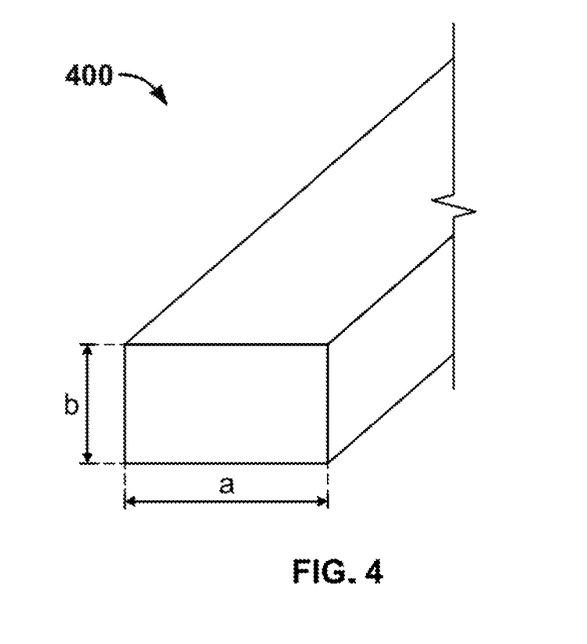
FIG. 4 illustrates a rectangular waveguide.

FIG. 4 illustrates a rectangular waveguide 400. As shown in the figure, rectangular waveguide 400 has a width a and a height b.

A normal rectangular waveguide has two aperture dimensions. The height of the waveguide dictates the wave impedance. For a rectangular waveguide, the cut-off frequency, $f_c$, is found by:

$$f_c = \frac{c}{2\pi}\sqrt{\left(\frac{m\pi}{a}\right)^2 + \left(\frac{n\pi}{b}\right)^2} \quad (1)$$

where m and n are the mode numbers and where a and b are the dimensions of the waveguide.

For a transverse electric (TE) mode having an order 10, i.e., TE10 mode (the preferred mode), the equation can be simplified to:

$$f_c = \frac{c}{2a} \quad (2)$$

As can be seen, only the width of the waveguide dictates the cut-off frequency. For dielectric filled waveguides, the width can be found as:

$$a_{dielectric\ waveguide} = \frac{a}{\sqrt{\varepsilon_r}}, \quad (3)$$

where $\varepsilon_r$ is the dielectric constant of the printed circuit board material.

The width of the waveguide may be further defined for a substrate integrated waveguide as:

$$a_{SIW} = a_{dielectric\ waveguide} + \frac{d^2}{0.95p}, \quad (4)$$

where d is the diameter of the via and p is the pitch (distance between) vias.

A key feature of a SIW microwave high pass filter in accordance with aspects of the present disclosure is that the stop-band rejection can be adjusted easily by the length of the SIW waveguide. The longer the waveguide, the higher the stop-band rejection. Also, since the top, bottom, and sidewalls are all electronically connected to ground, the structure has minimal radiation loss.

Figure 5:
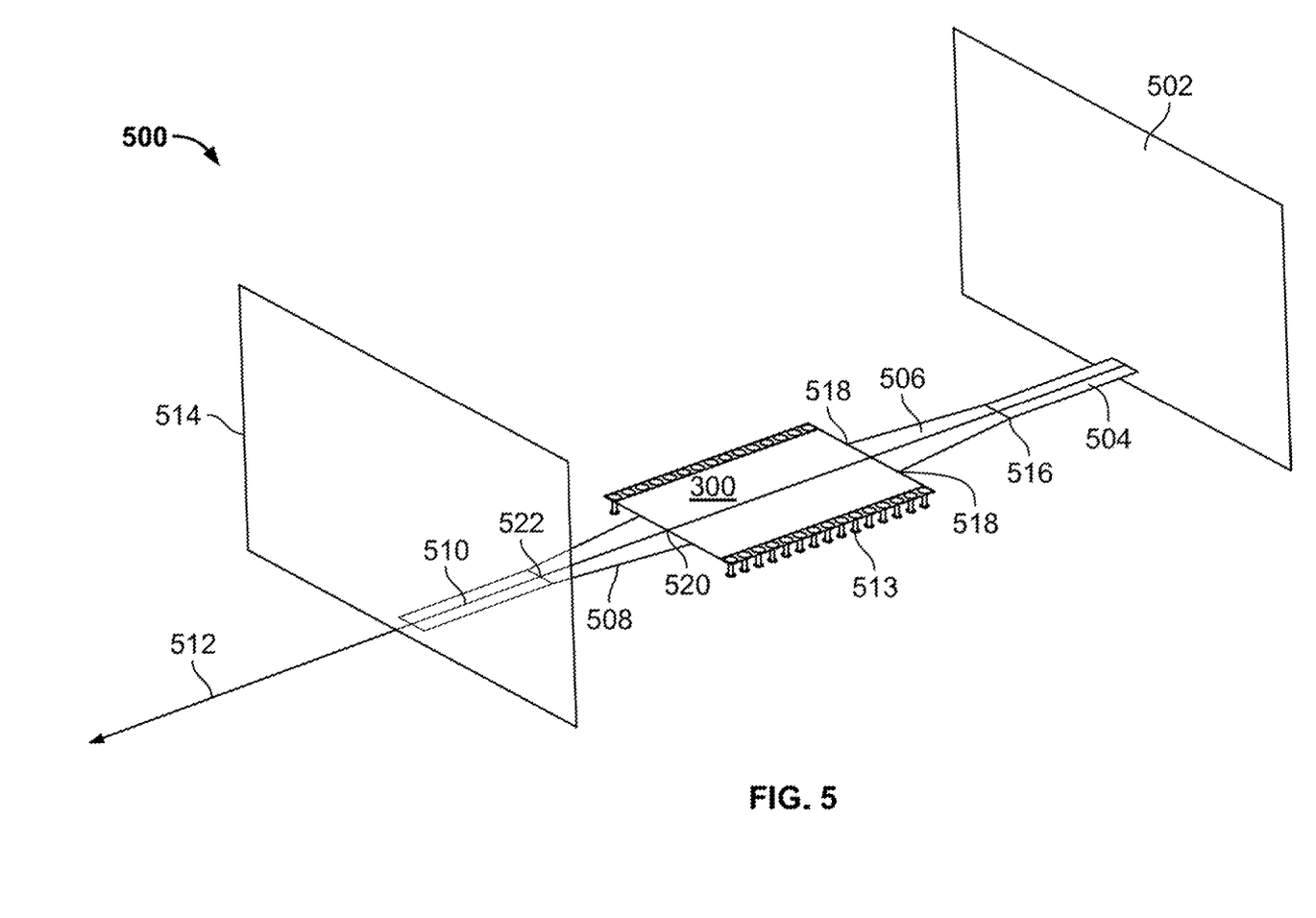
FIG. 5 illustrates an example substrate integrated waveguide filter in accordance with aspects of the present disclosure.

FIG. 5 illustrates an example simulated substrate integrated waveguide filter 500 in accordance with aspects of the present disclosure. As shown in the figure, waveguide filter 500 includes an input launch 502, an input microstrip waveguide 504, an input impedance-matching taper (IMT) transition metal layer 506, SIW 300, an output impedance-matching taper (OMT) transition metal layer 508, an output microstrip waveguide 510, a plurality of solder connections 513 and an output receiver 514.

Input microstrip waveguide 504 is disposed between input launch 502 and IMT transition metal layer 506. SIW 300 is additionally disposed between IMT transition metal layer 506 and OMT transition metal layer 508. OMT transition metal layer 508 is disposed between SIW 300 and output microstrip waveguide 510. Output microstrip waveguide 510 is disposed between OMT transition metal layer 508 and output receiver 514.

IMT transition metal layer 506 has an input end 516 in electrical connection with input microstrip waveguide 504 and an output end 518 in electrical connection with SIW 300. OMT transition metal layer 508 has an input end 520 in electrical connection with SIW 300 and an output end 522 in electrical connection with output microstrip waveguide 510.

IMT transition metal layer 506 has an IMT input end width at input end 516 and has an IMT output end width at output end 518, wherein the IMT output end width that is wider than the IMT input end width. Input launch 502 and output receiver 514 are simulator representations for a signal provider and signal receiver, respectively. In particular, input launch 502 provides a simulated input signal to input microstrip waveguide 504, whereas output receiver 514 receives the simulated output signal from output microstrip waveguide 510, along a signal path 512. Solder connections 513 electrically connect SIW 300 to ground.

Input microstrip waveguide 504 conducts an RF signal to IMT transition metal layer 506. Input microstrip waveguide 504 has an impedance, $z_{504}$. SIW 300 has an input impedance, $z_{300}$, which for purposes of discussion of the present disclosure does not match impedance $z_{504}$ of input microstrip waveguide 504. IMT transition metal layer 506 provides an impedance matching function to reduce reflection of the RF signal being fed through input microstrip waveguide 504 to SIW 300.

Similarly, output microstrip waveguide 510 has an impedance, $z_{510}$. In this example, for purposes of discussion, let SIW 300 have an output impedance that is equal to its input impedance, $z_{300}$. It should be noted that in other embodiments of the present disclosure, the output impedance of SIW 300 may not be equal to its input impedance. In any event, again for purposes of discussion, let the output impedance of SIW 300 of the present disclosure not match impedance $z_{510}$ of output microstrip waveguide 510. OMT transition metal layer 508 provides an impedance matching function to reduce reflection of the RF signal passing through SIW 300 to output microstrip waveguide 510.

Returning to FIG. 3, vias 312 and 310 create the waveguide sidewalls, whereas IMT transition metal layer 506 and OMT transition metal layer 508 provide for easy interface with other circuit elements.

Waveguide filter 500 may be used in a transmitter or a receiver system. For purposes of discussion, let waveguide filter 500 be used in a receiver. In such a situation, let input launch 502 generate a microwave signal that will simulate a microwave signal that is received by the receiver. The signal generated by input launch 502 will conduct through input microstrip waveguide 504 and into IMT transition metal layer 506. IMT transition metal layer 506 will provide an impedance matching function to reduce input signal reflection at output end 518. The portion of the signal that is not reflected at output end 518 will conduct through SIW 300.

SIW 300 will perform a high pass filter function on the received signal. As discussed above with reference to FIG. 4, the cut-off frequency of SIW 300 will be based on the length and width of SIW 300. SIW 300 will then pass the filtered signal to OMT transition metal layer 508, which will address the impedance mismatch between SIW 300 and output microstrip waveguide 510, thus reducing reflections from output end 522. Output microstrip waveguide 510 will then output the filtered signal for further signal processing by the remaining receiver circuitry (not shown).

Therefore, SIW 300 provides efficient high pass filtering of microwave signals, with a compact design that is easy to fabricate and integrate onto a multichip system. IMT transition metal layer 506 and OMT transition metal layer 508 address impedance mismatch to reduce signal reflection.

To assure proper signal filtering, a SIW microwave high pass filter in accordance with the present disclosure should be calibrated before it is deployed in a multichip system, such as a receiver or transmitter. Such calibration may be performed with a calibration kit.

Figure 6:
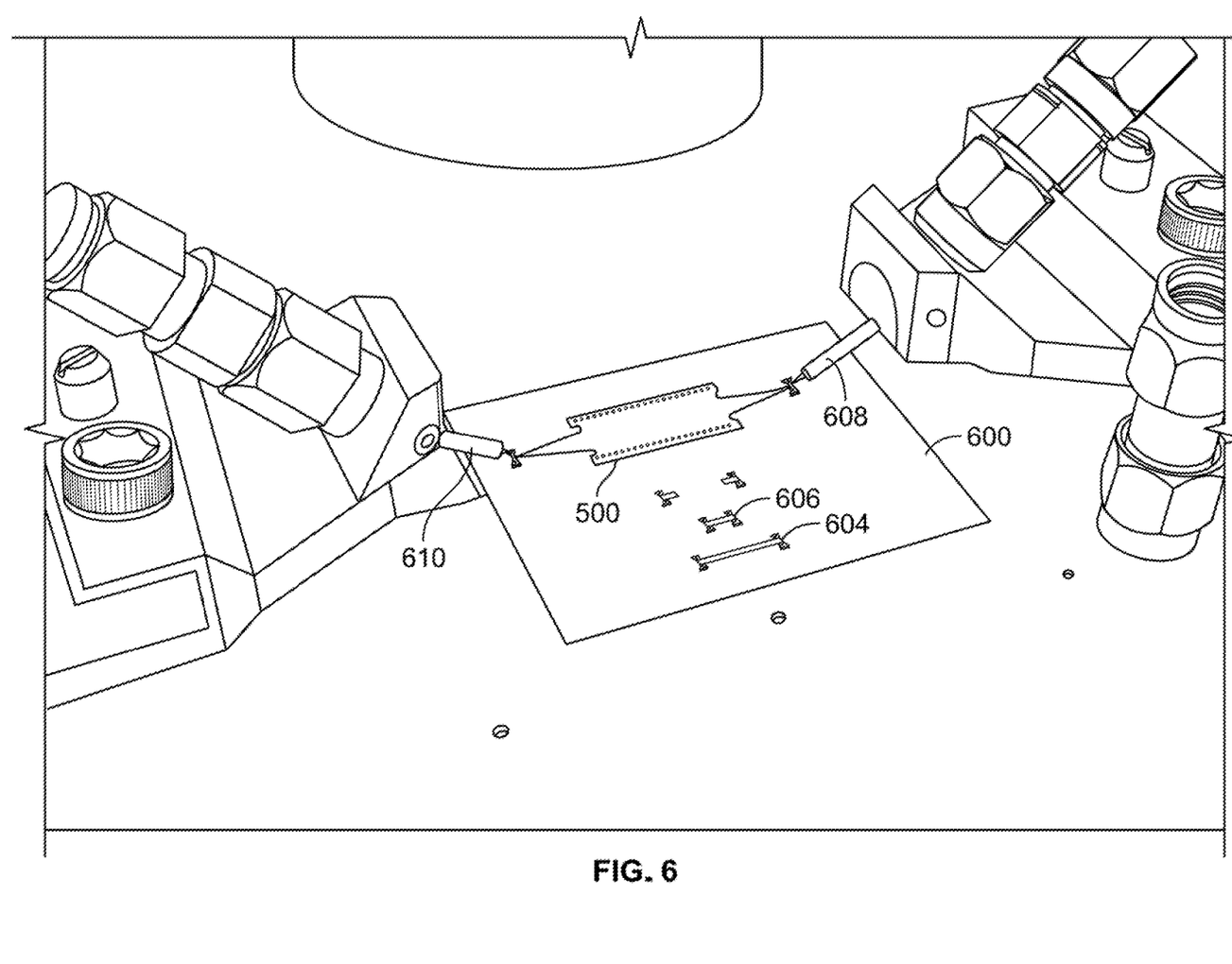
FIG. 6 illustrates the example substrate integrated waveguide filter of FIG. 5 with a calibration kit.

FIG. 6 illustrates example substrate integrated waveguide filter 500 with a calibration kit 600. As shown in the figure, a calibration kit 600 includes waveguide filter 500, a plurality of calibration parts, a sample of which are indicated as calibration parts 604 and 606, an input launch probe 608 and an output launch probe 610.

In operation, input launch probe 608 generates an input signal into waveguide filter 500, which filters the input signal. Output launch probe 610 detects the filtered signal from waveguide filter 500.

Input launch probe 608 has inherent effects on the input signal provided to waveguide filter 500 and output launch probe 610 has inherent effects on the signal detected by waveguide filter 500. To isolate the true filtered signal, these effects from input launch probe 608 and output launch probe 610 must be identified and addressed.

Calibration kit 600 de-embeds the effects from input launch probe 608 and output launch probe 610 from the measurement results taken by calibration parts, including calibration parts 604 and 606. Once calibrated, by accounting for measurement results from the calibration parts, the results caused by the probes are removed from the final measured results. The true filtering performance of the calibrated waveguide filter 500 may then be determined, which may then be used for design in a transmitter or receiver system.

Figure 7:
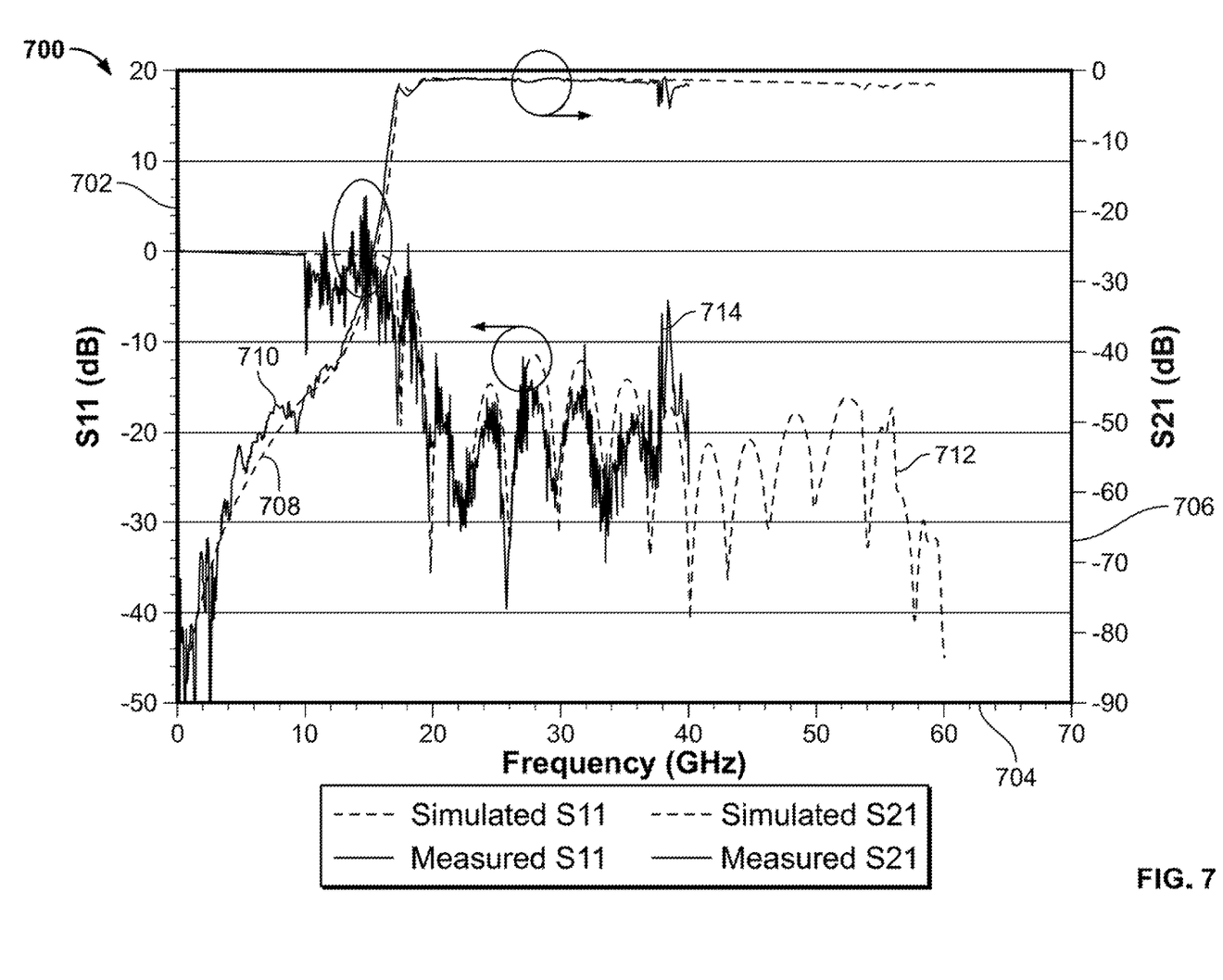
FIG. 7 illustrates a graph of measured and simulated band pass characteristics of a substrate integrated waveguide filter of FIG. 5.

FIG. 7 illustrates a graph 700 of measured and simulated high pass characteristics of SIW filter 500. As shown in the figure, graph 700 has a y-axis 702, an x-axis 704, a y-axis 706, a function 708, a function 710, a function 712 and a function 714.

Y-axis 702 is the S11 parameter representing the insertion loss, or how much power is reflected from waveguide filter 500, and is measured in dB. Y-axis 706 is the S21 parameter representing gain from waveguide filter 500 and is measured in dB. X-axis 704 is the frequency of the signal being transmitted by waveguide filter 500 and is measured in GHz.

Function 708 represents the simulated gain of a waveguide filter having dimensions of waveguide filter 500 as a function of frequency. Function 710 represents the measured gain of waveguide filter 500 as a function of frequency. Function 712 represents the simulated reflected power of waveguide filter 500 as a function of frequency. Function 714 represents the measured reflected power of waveguide filter 500 as a function of frequency.

As shown in graph 700, the simulated response shows low insertion loss from 18-50 GHz, and a steep roll-off below 16 GHz. The measured attenuation at 12 GHz is less than 15 dB. The return loss of the high pass filter is better than 10 dB from 19-60 GHz. Accordingly, measurement and simulated responses match very well. There is a slight resonance at 40 GHz, which may be attributed to the calibration structures.

A SIW high pass filter in accordance with aspects of the present disclosure is particularly useful because it can be easily integrated with multi-chip modules. It has a small size, high stop-band attenuation, and low pass band insertion loss.

Figure 8:
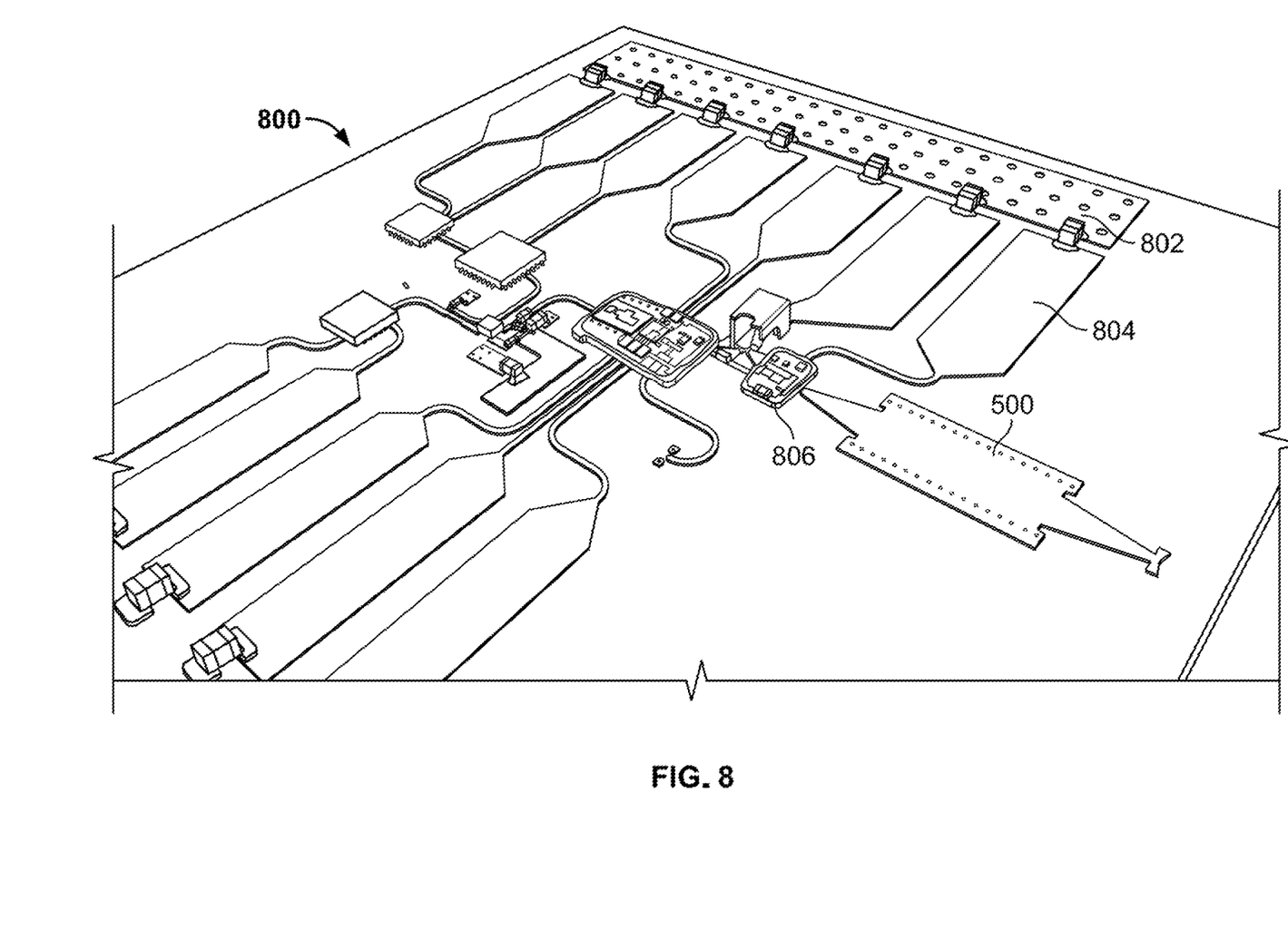
FIG. 8 illustrates an example fully integrated receiver module that includes the example substrate integrated waveguide filter of FIG. 5.

FIG. 8 illustrates an example fully integrated receiver module 800 that includes example SIW filter 500. As shown in the figure, receiver module 800 includes: SIW filter 500; a power bus 802; a plurality of conductor lines, a sample of which is indicated as conductor line 804; and a plurality of other surface mounted circuit components, a sample of which is a receiver component 806.

An SIW filter in accordance with aspects of the present disclosure may be used in any system than requires a high bandpass filter in the microwave region, non-limiting examples of which include transmitters and receivers. It should be noted that when used with a transmitter or receiver, a SIW filter in accordance with aspects of the present disclosure may be used with an antenna that is operable to receive an RF signal, wherein the SIW filter includes an input for electrical connection to the antenna.

The advantage of a SIW high pass filter in accordance with aspects of the present disclosure is that the filter is easily realizable, small in size, does not require lumped elements, and has low loss. Further a SIW high pass filter in accordance with aspects of the present disclosure can be tuned by changing the size, shape, and height to operate at different cutoff frequencies.

Further, in the example embodiments discussed above, the input-impedance-matching taper transition metal layer, the substrate integrated waveguide and the output-impedance-matching taper transition metal layer are arranged to have low frequency cut off at 18 GHz. However, this is provided merely as an example. A SIW filter in accordance with aspects of the present disclosure may have lower cut-off frequencies as required for a particular design.

The foregoing description of various embodiments have been presented for purposes of illustration and description. It is not intended to be exhaustive or to limit the disclosure to the precise forms disclosed, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto.

What is claimed as new and desired to be protected by Letters Patent of the United States is:

1. A high pass filter comprising:
   an input-impedance-matching taper transition metal layer having an IMT input end and an IMT output end, said IMT input end having an IMT input end width, said IMT output end having an IMT output end width that is wider than said IMT input end width;
   a substrate integrated waveguide having a SIW input end and a SIW output end, wherein said substrate integrated waveguide comprises a substrate, a conductive surface, an input electric wall, an output electric wall, a first plurality of conductive vias and a second plurality of conductive vias,
   an output-impedance-matching taper transition metal layer having an OMT input end and an OMT output end, said OMT input end having an OMT input end width, said OMT output end having an OMT output end width that is wider than said OMT input end width; and
   wherein said substrate integrated waveguide is arranged such that said IMT output end is electrically connected to said SIW input end and such that said OMT input end is electrically connected to said SIW output end.

2. The high pass filter of claim 1,
   wherein said conductive surface is disposed on said substrate, wherein said substrate is disposed on a ground plane and has a substrate input end and a substrate output end, wherein said input electric wall is disposed at said substrate input end and is electrically connected to said IMT output end, and wherein said output electric wall is disposed at said substrate output end and is electrically connected to said OMT input end.

3. The high pass filter of claim 2, wherein said first plurality of conductive vias are linearly disposed between said substrate input end and said substrate output end, wherein each of said first plurality of conductive vias is filled with an electrical conductor, wherein said second plurality of conductive vias are linearly disposed between said substrate input end and said substrate output end and are separated from said first plurality of conductive vias, and wherein each of said second plurality of conductive vias is filled with the electrical conductor.

4. The high pass filter of claim 3, wherein said input-impedance-matching taper transition metal layer, said substrate integrated waveguide and said output-impedance-matching taper transition metal layer are arranged to have low frequency cut off at 18 GHz.

5. The high pass filter of claim 2, wherein said input-impedance-matching taper transition metal layer, said substrate integrated waveguide and said output-impedance-matching taper transition metal layer are arranged to have low frequency cut off at 18 GHz.

6. The high pass filter of claim 1, wherein said input-impedance-matching taper transition metal layer, said substrate integrated waveguide and said output-impedance-matching taper transition metal layer are arranged to have low frequency cut off at 18 GHz.

7. A device for use with an antenna that is operable to receive an RF signal, said device comprising:

an input for electrical connection to the antenna;

an input-impedance-matching taper transition metal layer having an IMT input end and an IMT output end, said IMT input end having an IMT input end width, said IMT output end having an IMT output end width that is wider than said IMT input end width;

a substrate integrated waveguide having a SIW input end and a SIW output end, wherein said substrate integrated waveguide comprises a substrate, a conductive surface, an input electric wall, an output electric wall, a first plurality of conductive vias and a second plurality of conductive vias;

an output-impedance-matching taper transition metal layer having an OMT input end and an OMT output end, said OMT input end having an OMT input end width, said OMT output end having an OMT output end width that is wider than said OMT input end width; and a receiver module, wherein said substrate integrated waveguide is arranged such that said IMT output end is electrically connected to said SIW input end and such that said OMT input end is electrically connected to said SIW output end, wherein said IMT input end is electrically connected to said input, wherein said OMT output end is electrically connected to said receiver module, wherein said input-impedance-matching taper transition metal layer, said substrate integrated waveguide and said output-impedance-matching taper transition metal layer are operable to output a filtered RF signal based on the received RF signal, and wherein said receiver module is operable process the filtered RF signal.

8. The device of claim 7, wherein said conductive surface is disposed on said substrate, wherein said substrate is disposed on a ground plane and has a substrate input end and a substrate output end, wherein said input electric wall is disposed at said substrate input end and is electrically connected to said IMT output end, and wherein said output electric wall is disposed at said substrate output end and is electrically connected to said OMT input end.

9. The device of claim 8, wherein said first plurality of conductive vias are linearly disposed between said substrate input end and said substrate output end, wherein each of said first plurality of conductive vias is filled with an electrical conductor, wherein said second plurality of conductive vias are linearly disposed between said substrate input end and said substrate output end and are separated from said first plurality of conductive vias, and wherein each of said second plurality of conductive vias is filled with the electrical conductor.

10. The device of claim 9, wherein said input-impedance-matching taper transition metal layer, said substrate integrated waveguide and said output-impedance-matching taper transition metal layer are arranged to have low frequency cut off at 18 GHz.

11. The high pass filter of claim 8, wherein said input-impedance-matching taper transition metal layer, said substrate integrated waveguide and said output-impedance-matching taper transition metal layer are arranged to have low frequency cut off at 18 GHz.

12. The high pass filter of claim 7, wherein said input-impedance-matching taper transition metal layer, said substrate integrated waveguide and said output-impedance-matching taper transition metal layer are arranged to have low frequency cut off at 18 GHz.

13. A method comprising:

receiving, via an input for electrical connection to an antenna, an input signal from the antenna;

providing the input signal to an input-impedance-matching taper transition metal layer having an IMT input end and an IMT output end, the IMT input end having an IMT input end width, the IMT output end having an IMT output end width that is wider than the IMT input end width;

filtering the input signal, via a substrate integrated waveguide having a SIW input end and a SIW output end, to generate a filtered signal, wherein the substrate integrated waveguide comprises a substrate, a conductive surface, an input electric wall, an output electric wall, a first plurality of conductive vias and a second plurality of conductive vias;

passing the filtered signal to an output-impedance-matching taper transition metal layer having an OMT input end and an OMT output end, the OMT input end having an OMT input end width, the OMT output end having an OMT output end width that is wider than the OMT input end width; and passing the filtered signal to a receiver module, wherein the substrate integrated waveguide is arranged such that the IMT output end is electrically connected to the SIW input end and such that the OMT input end is electrically connected to the SIW output end, wherein the IMT input end is electrically connected to the input, wherein the OMT output end is electrically connected to the receiver module, wherein the input-impedance-matching taper transition metal layer, the substrate integrated waveguide and the output-impedance-matching taper transition metal layer are operable to output a filtered RF signal based on the received RF signal, and wherein the receiver module is operable process the filtered RF signal.

14. The method of claim 13, wherein the conductive surface is disposed on the substrate, wherein the substrate is disposed on a ground plane and has a substrate input end and a substrate output end, wherein the input electric wall is disposed at the substrate input end and is electrically connected to the IMT output end, and wherein the output electric wall is disposed at the substrate output end and is electrically connected to the OMT input end.

15. The method of claim 14, wherein the first plurality of conductive vias are linearly disposed between the substrate input end and the substrate output end, wherein each of the first plurality of conductive vias is filled with an electrical conductor, wherein the second plurality of conductive vias are linearly disposed between the substrate input end and the substrate output end and are separated from the first plurality of conductive vias, and wherein each of the second plurality of conductive vias is filled with the electrical conductor.

16. The method of claim 15, wherein the input-impedance-matching taper transition metal layer, the substrate integrated waveguide and the output-impedance-matching taper transition metal layer are arranged to have low frequency cut off at 18 GHz.

17. The method pass filter of claim 14, wherein the input-impedance-matching taper transition metal layer, the substrate integrated waveguide and the output-impedance-matching taper transition metal layer are arranged to have low frequency cut off at 18 GHz.

* * * * *